United States Patent [19]

Elliston et al.

[11] Patent Number: 4,939,373
[45] Date of Patent: Jul. 3, 1990

[54] ELECTRON IMAGE PROJECTOR

[76] Inventors: Thomas V. Elliston, 1 Pagoda Avenue, Richmond, Surrey, United Kingdom, CB4 3EU; Julian P. Scott, 33 Surrenden Crescent, Brighton, Sussex, United Kingdom, BN1 6WE; Rodney Ward, 38 The Millbank, Ifield, Crawley, Sussex, United Kingdom

[21] Appl. No.: 883,007

[22] Filed: Jul. 7, 1986

Related U.S. Application Data

[63] Continuation of Ser. No. 645,881, Aug. 30, 1984, abandoned.

[30] Foreign Application Priority Data

Sep. 5, 1983 [GB] United Kingdom ............... 8323769

[51] Int. Cl.$^5$ ............................................. H01J 37/30
[52] U.S. Cl. .................................. 250/492.3; 250/398
[58] Field of Search ............... 250/492.1, 492.2, 492.3, 250/492.24, 396 R, 398, 399; 313/348

[56] References Cited

U.S. PATENT DOCUMENTS 3,849,659 11/1974 O'Keefe ........................... 250/492.2
4,039,810 8/1977 Heritage ........................... 250/492.2

FOREIGN PATENT DOCUMENTS 2700357 7/1978 Fed. Rep. of Germany ... 250/492.2
2719799 11/1978 Fed. Rep. of Germany ... 250/492.1
0132269 11/1978 Japan ................................. 250/492.2

OTHER PUBLICATIONS

Scott, 1:1 Electron Image Projector, Solid State Technology, vol. 20, No. 5, May 1977, pp. 43–47.
IBM Technical Disclosure Bulletin, vol. 21, No. 11, Apr. 1979, pp. 4682–4683.

Primary Examiner—Bruce C. Anderson

[57] ABSTRACT

An electron image projector for projecting mask patterns with unity magnification onto a semiconductor slice comprises a cathode from which emitted electrons are accelerated by a uniform electric field and focussed by a uniform magnetic field onto a target. To reduce the dependency of electron trajectories on the local shape and disposition of the target, the uniform electric field is applied by an accelerating voltage between the cathode and a grid electrode acting as the anode between the cathode and target. The grid is positioned at a first magnetic focus, and the target is positioned at a second magnetic focus of the uniform magnetic field. A small voltage much less than the accelerating voltage may be applied between the grid and the target to obtain correct focussing. Structure is also provided to move the grid parallel to the target during exposure in order to prevent the grid pattern from being reproduced on the target. A backscattered electron detector positioned adjacent the field-free region between the grid and the target may be used to control alignment of the projected image with the target.

11 Claims, 1 Drawing Sheet

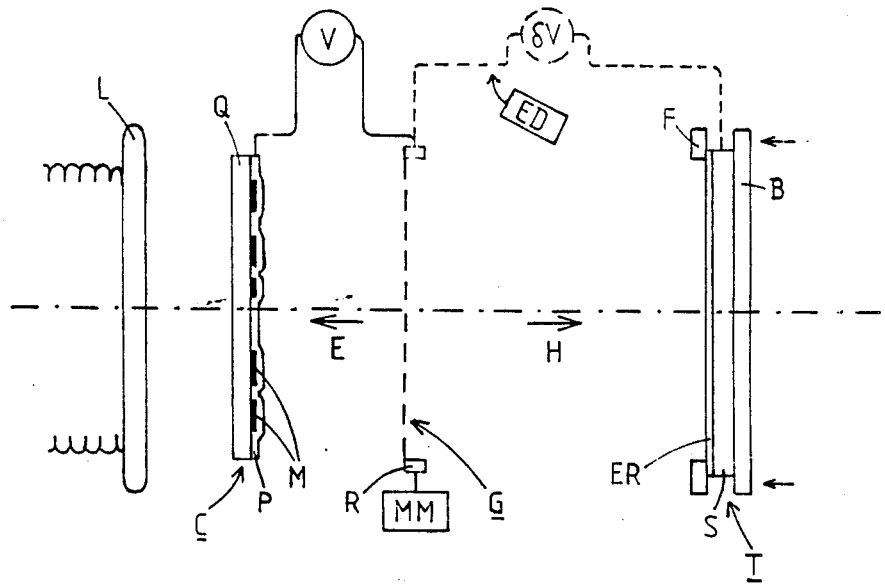
FIG. 1
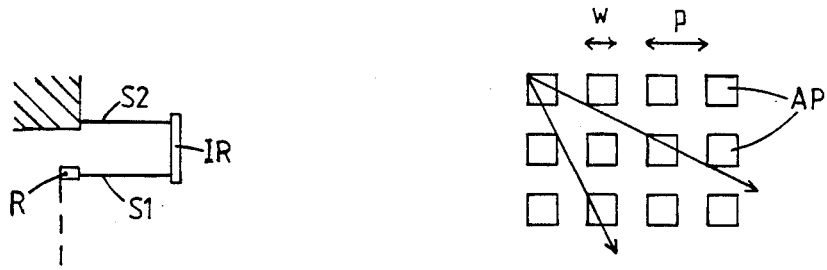
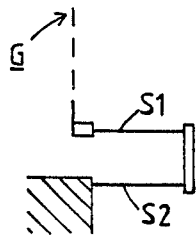
FIG. 2
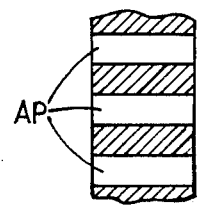
FIG. 3
FIG. 4

ELECTRON IMAGE PROJECTOR

This is a continuation application Ser. No. 645,881, filed Aug. 30, 1984 abandoned.

The invention relates to an electron image projector for projecting electrons emitted by a cathode onto a target under the action of a substantially uniform electric field wherein the electrons are emitted in a predetermined spatial pattern extending transversely to the electric field with the projector comprising an electron emissive cathode, anode means parallel to the cathode whereby in operation the electric field is produced between the cathode and the anode, and means for producing a substantially uniform magnetic field parallel to the electric field to focus the electrons onto the target whereby the spatial pattern is reproduced thereon with substantially unity magnification.

Unity magnification electron image projectors are known from, for example, the paper "1:1 Electron Image Projector" by J. P. Scott, Solid State Technology, May 1977, pages 43–47, and the reference therein. Such projectors may be used in the fabrication of integrated circuits by projecting a mask pattern onto a semiconductor slice with high resolution. With substantially unity magnification, all parts of the usable area of the slice may be exposed simultaneously. In a typical projector, the mask and the slice ar aligned parallel to one another a short distance apart; the mask comprises a disc of a material (such as quartz) transparent to ultraviolet radiation with the disc supporting a layer of opaque material (such as chromium) in the desired pattern and an overall layer of photoemissive material (such as CsI), and forms the cathode of an electron-optical system, of which the slice forms the anode (target). A large potential difference (typically 20 kV) is applied between the cathode and anode, a uniform magnetic field (typically 1 kG or more) is applied parallel to the electric field between cathode and anode, and the layer of photoemissive material on the mask is illuminated with UV-radiation. Electrons are emitted from those portions of the photoemissive layer not screened from the UV-radiation by the pattern of opaque material, and are accelerated by the electric field to impinge on the anode. The electrons are directed generally in mutually parallel straight lines parallel to the electric and magnetic fields. To be more exact electrons which are emitted at an angle to the normal to the cathode describe a helix about a magnetic field line as they travel from cathode to anode, the number of revolutions described being independent of the angle to the normal, and the distance between the cathode and anode being selected (in dependence on the values of the electric and magnetic fields) so that the number of revolutions is substantially an integer, typically, unity. Electrons emitted from any particular point on the cathode over a range of angles about the normal are thereby focussed to impinge on substantially the same point on the anode, so that the pattern of the cathode as a whole is reproduced on the anode with unity magnification. The anode is said to be at a magnetic focus with respect to the cathode; when the above-mentioned integral number of revolutions is unity, the anode is said to be at the first magnetic focus. Although an individual electron may follow a helical path as described, it is emphasized that the general direction of motion is a straight line parallel to the electric and magnetic fields.

Such an electron image projector has the disadvantage that the target forms an essential functional integer of the electron-optical system because it is the anode and therefore it can cause perturbations of the electric field (which ideally should be exactly uniform and normal to the mask and target) and hence the electron trajectories in its vicinity. In the fabrication of integrated circuits, which requires the successive exposure of different patterns onto the slice (the slice being coated each time with a suitable electron-sensitive resist), this means that the slice must either be flat, or be reproducibly non-planar so as to reproduce the same perturbations over the slice. Inevitably the electric field will suffer some distortion at the periphery of the slice. This can be a problem if the wafer is held on the type of electrostatic chuck shown in FIG. 4 of the aforementioned paper by J. P. Scott, in which an overlapping lip is present at the surface of the slice facing the cathode. In this case it is necessary to locate the slice with great precision for each subsequent exposure in order to obtain optimum registration of the successive patterns. To satisfy these requirements is time-consuming and inconvenient, particularly (with regard to planarity) because the electron image projector has a large depth of focus (typically 100 $\mu$m) and does not require the slice to be flat for adequate resolution over the slice. (It may be noted that the magnetic field may be made slightly diverging or converging to compensate for net overall expansion or contraction of the slice relative to the mask between successive exposures.)

According to the invention, an electron image projector as set forth in the opening paragraph is characterized in that the anode means comprises a grid having an array of electron permeable regions, which array is at least as extensive as the spatial pattern of electrons, and in that the grid is disposed between the cathode and the target. This provides the advantage that the dependence of the electron trajectories on the shape and/or disposition of the target can be reduced. In operation the electric field resulting from a potential difference between the grid and the target may be much less than the electric field resulting from a potential difference between the cathode and the grid. The electron trajectories between the grid and the target are thus little affected, and the dependence is much reduced. Suitably, there is in operation substantially no potential difference between the grid and the target: the dependence can thereby be substantially eliminated, and other equipment may readily be used in the region between the grid and the target without substantially affecting the electron trajectories, as will be mentioned again below.

The surface of the grid facing the cathode is preferably substantially at a focus of the magnetic field. Thus when the target is also substantially at a magnetic focus any distortion which otherwise may have been introduced by the electric lens effect of the grid into the projection of the electrons from the cathode to the target is optimally compensated by the magnetic field, and selecting the first magnetic focus for the grid, i.e. the focus closest to the cathode, enables the projector to be relatively compact. With such an arrangement wherein in operation the electric field resulting from a potential difference between the grid and the target is much less than the electric field resulting from a potential difference between the cathode and the grid or wherein in operation there is substantially no potential difference between the grid and the target, the spacing between the grid and the target suitably may be substantially twice the spacing between the cathode and the grid. The target will thereby be substantially at the second magnetic focus, since the (substantially constant) velocity of the electrons between the grid and the target will be twice the average velocity of the electrons between the cathode and the grid.

In an embodiment of the invention wherein the grid comprises an array of relatively electron-permeable and electron-impermeable regions, the projector suitably comprises means for moving the grid transverse to the direction of motion of the electrons so that the pattern produced on the target by exposure thereof to the electrons does not substantially reproduce the array of the grid.

In a conventional electron image projector, electrons backscattered from the target as a result of the electron irradiation thereof are accelerated by the electric field back towards the target and impinge on it generally at a different position from where they originally impinged, thereby degrading the quality of reproduction of the spatial pattern on the target. In an embodiment of the invention wherein the grid comprises a substantially regular array of relatively electron-permeable regions separated by relatively electron-impermeable regions, the lengths of the relatively electron-permeable regions in the direction of motion of the electrons may be not substantially less than three times the widths thereof in a direction transverse to the direction of motion of the electrons. Electrons are backscattered from the target over a wide range of angles to the normal, and therefore in general have a substantial transverse component of velocity. As a result, they describe helices of large radii about the magnetic field lines (generally far larger than the radii of the helices described by the imaging electrons, which are emitted from the cathode with only low energies). Consequently, in such an embodiment of the invention the probability that electrons which enter the electron permeable regions of the grid on the target side will be able to pass through the grid and into the region where they would be subjected to a substantial acceleration back towards the grid and the target is rather small; instead, the electrons collide with and may be absorbed by the grid on the surface portions of the relatively electron-impermeable regions. Such a grid may for example be formed from a thick silicon wafer, from photo-etchable glass, or from a channel plate.

An electron image projector embodying the invention may comprise means for detecting electrons backscattered from the target during electron irradiation whereby to detect the location of a market region of the target. The detector is disposed generally between the grid and the target outside the region occupied by the projected electrons. In the case where the grid and the target are at substantially the same potential the detector is in a substantially field free region and therefore its presence does not cause electric field perturbations which would otherwise affect the electron trajectories. Detecting the backscattered electrons can enable a considerable simplification of alignment markers on a target comprising a semiconductor slice for integrated circuits. With a silicon slice, for example, instead of using tantalum oxide markers on the slice, which requires several steps of processing the slice, and detecting the location of the markers by their X-radiation under electron irradiation, the markers may simply be formed by $SiO_2$, which requires a single processing step or (with a silicon slice the crystallographic orientation of whose surface is the usual (100)) by V-shaped grooves etched into the surface of the slice: in both cases, the markers are much more compatible with the processing required for making the integrated circuits.

Embodiments of the invention will now be described by way of example with reference to the diagrammatic drawings, in which:

FIG. 1 illustrates schematically some compounds of an electron-image projector embodying the invention;

FIG. 2 illustrates schematically an arrangement for supporting the grid of the projector of FIG. 1;

FIG. 3 illustrates diagrammatically one form of aperture array, and

FIG. 4 illustrates diagrammatically apertures with a relatively large ratio of longitudinal to transverse dimension.

Referring to FIG. 1, an electron image projector embodying the invention comprises a cathode C, a grid G, and a target T which are mounted parallel to one another in an evacuable chamber (not shown). The cathode C is mounted in a holder (not shown) rotatable about the projector's longitudinal axis, denoted by a horizontal dash-dot line in FIG. 1, and comprises a quartz disc Q which is transparent to ultra-violet radiation and which supports a patterned layer, opaque to ultra-violet radiation, of mask material M (of which two spaced portions are referenced in FIG. 1) and a continuous, thin, overall layer of photoemissive material P. The schematically-indicated grid G is electrically conductive and non-magnetic, and consists of a regular array of alternately relatively electron-permeable and relatively electron-impermeable regions, as will be described in greater detail below. The grid is mounted on a ring R which is supported in the projector, for example as described hereinafter with reference to FIG. 2, and which in operation is moved parallel to the cathode C and target T by moving means MM. The target T comprises a slice S of semiconductor material which in this case is held in a mechanical chuck with the peripheral portion of the slice being urged against a mainly annular member F by a backing plate B under spring pressure denoted by the arrows. The surface of the slice S facing the grid G and the cathode C is coated with a layer of electron-sensitive resist material ER.

An ultra-violet lamp L is operable to illuminate the cathode C from the side thereof remote from the grid, suitably from outside the vacuum chamber through a transparent portion thereof.

In operation, a high direct voltage V, typically 20 kV, is applied between the cathode C and grid G (via ring R) to accelerate towards the grid electrons emitted under irradiation from the ultra-violet lamp L by those portions of the layer of photoemissive material P which do not overlie the mask material M and which therefore are exposed to radiation from the lamp L. The applied voltage produces over the operating area of the mask a substantially uniform electric field E extending parallel to the longitudinal axis between the cathode and the grid. A substantially uniform magnetic field H (produced in known manner by an air-cored solenoid, not shown) extends, also parallel to the longitudinal axis, at least in the whole of the region between the cathode C and the targe T. The electrons are thus directed generally in mutually parallel straight lines parallel to the electric and magnetic fields from the cathode C towards the target T. The magnitudes of the electric and magnetic fields and the longitudinal spacing between the layer of photoemissive material P of the cathode and the grid G are selected to be such that the surface of the grid G facing the cathode is located substantially at the first magnetic field focus in relation to the cathode: a focussed electron image of the spatial pattern of the mask material M is thus formed substantially in the entrance plane of the grid G. (Calculations suggest that the magnetic focus should ideally be located just beyond the entrance plane so that the latter is very slightly closer to the cathode.)

Electrons which are able to pass through the apertures of the grid G enter the region between the grid G and the target T that is substantially free of electric field, with there suitable being substantially no potential difference between the grid and the target. The electrons continue to travel generally in mutually parallel straight lines still under the influence of the magnetic field H, substantially at the velocity to which they have been accelerated by the voltage V until they impinge on the electron-sensitive resist ER on the semiconductor slice S with the slice being located at the second magnetic focus in relation to the cathode C. Because of the magnetic field an individual electron will actually follow a helical path about a magnetic field line if it is emitted at an angle other normally to the cathode C. Since the longitudinal distance which electrons travel in describing one revolution of a helix under the action of the magnetic field is proportional to their velocity, and since the velocity of the electrons between the grid G and the target T is substantially twice the average of their velocity between the cathode C and the grid G, the spacing of the target T from the grid G is substantially twice the spacing of the grid G from the cathode C.

It is noted here that the grid can act as an electric lens tending to deflect the electrons passing through it. If unchecked this could cause distortion of the electron image projected onto the target. More precisely, the electric lens effect imparts an additional transverse velocity component to an electron thereby modifying the radius of its helical path. However, with the grid and target at respective first and second magnetic foci the electron in travelling from the grid to the target will describe a complete revolution of a helix and therefore the net effect is that the electron suffers zero deflection and hence the electron image is projected onto the target T substantially without distortion.

A small voltage $\delta V$ which is much less than the accelerating voltage V, for example typically a few per cent or less, and not more than about 5% thereof, may be applied between the grid G and the target T, as shown in dashed lines in FIG. 1, to ensure that the electron image is correctly focussed on the target.

The anode of the projector is thus formed mainly or substantially wholly by the grid G.

During exposure of the target to electron irradiation, the grid G is moved by the means MM in its own plane so that the array of the grid menas is not reproduced on the target but instead all portions of the electron image of the cathode C can pass through the grid for part of the duration of the exposure and cause the same exposure (measured, for example, in terms of charge per unit area) of the resist ER on the semiconductor slice S.

In the process of fabricating integrated circuits, it is necessary to expose the semiconductor slice to a respective pattern in each of a plurality of photolithographic stages of the process. In order to ensure registration of the patterns, it is necessary to determine for each exposure the exact disposition of the slice relative to the projected pattern. This may be done using markers which remain on the slice throughout the process and corresponding markers on each mask. In a conventional image projector the markers on the slice may be formed from tantalum oxide and may be detected by the X-radiation they emit under electron irradiation from the corresponding markers on the mask. However, this has the disadvantages that:

(a) The detected X-rays are very weak, because the efficiency of their generation is low and because the X-rays must be detected on the side of the semiconductor slice remote from the cathode after suffering considerable attentuation by the slice itself and by the chuck used to hold the slice; an X-ray detector cannot be used on the side of the slice facing the cathode, since even though not directly between the cathode and the slice, it would significantly distort the electric field therebetween.

(b) The provision of the tantalum oxide markers on the slice is not readily compatible with the processing of the slice required to form the integrated circuits, and necessitates several additional processing steps. In a projector embodying the invention wherein in operation the electric field resulting from a potential difference between the grid means and target is much less than the electric field resulting from a potential difference between the grid means and the cathode or is substantially zero, the location of a marker on the target slice may be ascertained by detecting backscattered electrons with an electron detector ED (FIG. 1) positioned generally between the grid and the target, outside the area within which the image is projected. (The marker may be detectable as a result of a difference between the back-scattering coefficients of the marker and an adjacent region of the slice and/or of a variation in back-scattering at an edge of the marker due to a change in topography of the slice there.) It is noted here that in a conventional unity magnification electron image projector it is not possible to use an electron detector (i) because the electrons which are backscattered from the target under electron irradiation tend to be accelerated back towards the target and (ii) because the presence of the detector perturbs the electric field thereby affecting the electron trajectories and distorting the projected pattern of electrons.

The output of the electron detector ED may be used to control the alignment of the projected image with the slice in known manner, using magnetic deflection. The markers may be formed of a material much more compatible with semiconductor processing, for example in the case of a silicon slice, from $SiO_2$, which does not necessitate any additional processing steps, or may consist of a topographical feature formed at the surface of the slice. Furthermore, the backscattered electrons are much more readily detectable than the X-rays in a conventional projector, particularly because the efficiency of thier generation is some 5 orders of magnitude greater than that of X-rays. This provides the advantages that the markers may be smaller, thereby increasing the usable area of the slice, and/or that the proportion of the total exposure of the electron resist ER required to effect alignment of the mask and slice with the alignment typically being performed automatically during an initial fraction of the exposure, can be smaller, thereby generally improving net resolution in the total exposure.

If there is a potential difference between the grid means and the target so that there is an electric field therebetween, the electron detector may be at a suitable potential intermediate the potentials of the grid means and the target so as not significantly to affect the trajectories of the imaging electrons. Suitably, however, the grid means, the target and the electron detector are at the same potential, allowing the greatest freedom in positioning the electron detector and ensuring that the electron trajectories are not affected by its presence.

The maximum appropriate transverse dimension of each aperture of the grid will be dependent on the desired resolution of the image projected onto the target. The larger the transverse dimension of an aperture is, the more the electric field in the region between the cathode and the grid will tend to "bulge" out of the entrance surface of the grid means and towards the target, into the region in which it is desired there should be little or no electric field: this will result in some local distortion of the portion of the cathode spatial pattern projected through the aperture. On the other hand, it is undesirable for the transverse dimension of each aperture to be extremely small because in addition to the possible difficulties of making such a grid, the ratio of the transverse dimension of each aperture to the pitch of the apertures would probably have to be relatively low for the grid to have adequate mechanical strength; this would result in the grid having relatively low optical transparency (treating the electron-impermeable portions of the grid, i.e. the material between the apertures, as optically opaque) and consequently low electron permeability. Furthermore, the smaller the transverse dimension of each aperture is, the greater is the probability that the helical paths of the electrons will cause them to collide with the wall of an aperture as they travel along the aperture, with the result that the net electron permeability of the grid would be significantly less than the optical transparency thereof; the smaller the transverse dimension of the apertures, the greater is the difference between these two quantities. A reduced electron permeability has the disadvantages of reducing the efficiency of projection, necessitating a longer exposure for the same photoemission current density, and increasing the power dissipated in the grid and hence the temperature it attains in operation: this in turn may cause difficulties in maintaining the grid flat. With the arrangement indicated schematically in FIG. 1, the ring R suitably has a coefficient of thermal expansion which is at least as great as that of the grid G so that the grid may be held taut as the temperature of the grid rises.

Calculations indicate that for a desired resolution of about 0.1 $\mu$m, apertures with a transverse dimension of about 100–200 $\mu$m should be suitable. The width of material between adjacent apertures of the grid may suitably be comparable to the transverse dimension of each aperture to obtain an appropriate compromise between net electron permeability and mechanical strength of the basic grid. However, a further factor to be borne in mind is that the grid is subjected to a substantial attration towards the cathode owing to the large potential difference therebetween. Since the grid is supported in the projector only around its periphery, this force will tend to make the grid bow. Now while the grid should ideally be flat for undistorted reproduction of the spatial pattern of the mask, some out-of-flatness will be acceptable provided that it remains substantially the same both during an exposure (for optimum resolution) and for successive exposures on the same semiconductor slice (so that successive masks will be imagined with the same distortion and the images will therefore be substantially in registration). However, should it become necessary to change the grid between successive exposures on the same slice, it would be difficult to satisfy this condition unless the extent of bowing is limited so that the variation in bowing from one exposure to another is not more than one or two microns. With a thin basic grid structure, it may therefore be desirable to add a coarse strengthening grid with a much greater longitudinal thickness, for example a millimeter.

By way of example, various alternative ways in which the grid means may be realised are:

(1) The grid may be formed from a thin copper sheet which is held tautly at its periphery on the ring R with an array of apertures being formed in the sheet for example by standard photolithography and chemical etching or by spark erosion.

(2) The grid may be formed from a sheet of a suitable plastics material, for example Kapton (Registered Trade Mark), similarly held tautly at its periphery on a ring; apertures may be formed in the sheet by for example a laser with a thin layer of conductive material being subsequently provided, for example by vacuum deposition, on the surface of the sheet which is to face the cathode.

(3) The grid and outer supporting ring may be formed integrally from a wafer of silicon. For example:

(a) In one method, one surface of the wafer is heavily doped with boron in the desired pattern of the grid material which is to remain between the apertures with the boron being diffused in to a depth of a few microns; a peripheral portion of the wafer is masked off to define the outer ring, and the undoped and unmasked silicon is then chemically preferentially etched away to leave the desired integral structure. The wafer may initially be of usual thickness (a few hundred microns) and the eventual grid of only a few microns thickness. This method is thus best suited to forming apertures with a relatively low ratio of longitudinal to transverse dimension, e.g. approximately 1:1.

(b) In another method, a silicon wafer having a surface orientation of (110) may be etched anisotropically in a photolithographically-defined aperture array down {111} planes of the wafer, these planes extending normal to the (110) surface and in directions at an angle of some 70° to each other. Since the etching rate in the <110> direction may be many hundred times the etching rate in the <111> direction, undercutting may be insignificant. (Anisotropic etching is known from, for example, the paper "Anisotropic etching of Silicon", by K. E. Bean, IEEE Transactions on Electron Devices, Vol. Ed-25, No. 10 (October 1978), pages 1185–1193.) The thickness of the wafer may lie in a range from a few hundred microns to 2 mm. This method is thus particularly suited (but not limited) to forming apertures with relatively large ratios (for example, 3:1 or more) of longitudinal to transverse dimension.

(4) The grid may comprise a glass channel plate, as normally used for electron multiplication with a voltage applied between opposite faces of the plate; in this case, no voltage need be applied between the opposite faces, and the electrode on the face of the plate facing the cathode is used as the anode electrode of the projector. For apertures of for example 100 μm transverse dimension, the matrix from which the channel plate is made would not need to be drawn down as much as is normally necessary when the channels have a transverse dimension of for example 12 μm.

(5) The grid may be formed from an apertured sheet of photo-etchable glass, for example Fotoform (Registered Trade Mark) glass available from Corning, the apertures having been defined and formed by photolithography and etching: a metal electrode is deposited on the surface which is to face the cathode. This method is best suited to forming apertures with a relatively large transverse dimension, e.g. 200 μm.

The alternatives mentioned at (4) and (5) above, as well as that mentioned at 3(b), may be particularly suitable if it is desired to have apertures with a relatively large ratio of longitudinal to transverse dimension. With both a channel plate and an apertured sheet formed from photo-etchable glass, the glass has sufficient electrical conductivity for it not to become substantially charged in operation by electrons (imaging and back-scattered) adsorbed thereon.

Where the grid means have significant thickness, it is not necessary for the apertures to be of constant cross-sectional area through the thickness. It is only generally desirable that each of the apertures should comprise substantially a right cylindrical bore whose axis is parallel to the longitudinal axis of the projector and whose cross-section perpendicular to the axis is that of the aperture at the end thereof nearest the cathode i.e. the entrance end for imaging electrons, so that an imaging electron which enters the aperture from the cathode will be able to pass through the aperture (provided the diameter of its helical path and the spacing of the axis of that helical path from the periphery of the entrance end of the aperture are not such that its path would cause it to leave the above-mentioned cylindrical bore). Thus where the apertures are of circular cross-section and are formed by etching, the apertures may for example each be of frusto-conical shape with the smaller-diameter end constituting the entrance end of the aperture. On the other hand, if the grid means comprise a channel plate (the channels being right cylinders), it is desirable that the axis of the channels should be fairly acurately parallel to the longitudinal axis of the projector (say to within 1°).

As mentioned above, the grid is moved in its own plane during electron irradiation in such a manner that all portions of the electron image may be uniformly exposed on the target. To permit the grid to move so that it remains accurately parallel to the cathode and a constant distance therefrom, it may be mounted for parallel motion with the arrangement shown schematically in FIG. 2. The ring R is connected by longitudinally-extending spring members S1 to an intermediate ring IR which in turn is connected to the housing by longitudinally-extending spring members S2 radially spaced from the members S1. If only linear motion in a single direction is required, the spring members may be flat strips positioned at diametrically opposite regions of the ring R; if more complex motion is required, the spring members may be wires positioned as desired around the periphery of the ring.

The means MM for moving the grid during an exposure may comprise at least one conductor which extends around a small portion of the periphery of the ring R and through which a varying current, for example an alternating current, is passed so as to produce a varying radial translating force on the ring as a result of interaction with the magnetic field H; for translation with components in each of two mutually perpendicular directions, two such conductors spaced around the periphery of the ring by 90° may be used. As an alternative, the moving means may comprise one or more piezoelectric transducers. Each of these electromechanical moving means has the possible disadvantage that an electric field associated therewith may interfere with the uniformity of the desired electric field E between the cathode and the anode. The movement of the grid suitably is effected pneumatically, either from outside of the vacuum chamber via bellows, or with one or more Bourdon tubes within the chamber.

To obtain uniform exposure, the grid may be moved in a manner selected according to the configuration of the aperture array. For example, in the case of a uniform array of square apertures arranged in rows and columns parallel to orthogonal axes, the transverse dimension of each aperture being w and the pitch or spacing of the apertures being p parallel to each of the axes, the grid may be subjected to uniform rectilinear motion, the extent of the movement being an integral number of pitches along each axis and the direction of the movement being such that the ratio of the integral numbers is w/p. FIG. 3 shows, on a larger scale than FIGS. 1 and 2, a portion of such an aperture array (two of the apertures being referenced AP in FIG. 3) wherein w/p=½, two suitable directions of movement being indicated in the Figure by arrows. Other kinds of movement will be appropriate to other configurations, e.g. if the pitch parallel to one axis differs from the pitch parallel to the orthogonal axis, if successive rows are staggered, or if the apertures are not square. For example, with an array of apertures each in the shape of a parallelogram, such as are obtained in the manner of realising the grid described at 3(b) above, a suitable direction of movement is perpendicular to one side of the parallelogram.

In electron image projectors, a proportion of the imaging electrons incident on the target are backscattered, but whereas the imaging electrons impinge on the target substantially normally, those that are backscattered are distributed over a wide range of angles. In a conventional projector, such backscattered electrons are accelerated by the electric field between the cathode and the target back towards the target, and impinge again on it, generally at a point other than where they previously impinged. This undesired irradiation of the target constitutes a form of "background" or "noise" which degrades the resolution of the desired image. In a projector embodying the present invention, electrons backscattered from the target are generally able to reach the target side of the grid. If the apertures of the grid have a relatively low ratio of longitudinal to transverse dimension (such as 1:1 or less), a substantial proportion of those backscattered electrons which enter apertures of the grid on the target side are able to pass right through the apertures to the cathode side; they then enter the electric field between the cathode and the grid where they can be accelerated back towards the grid and thence (if they permeate it) travel on to the target. There can hence still be an appreciable "background" although to a lesser extent then in an otherwise comparable conventional projector. However, with a larger ratio of longitudinal to transverse dimension (suitably not substantially less than 3:1), the proportion of those backscattered electrons which enter apertures of the grid on the target side and which are then able to pass right though the apertures to the cathode side is significantly reduced. For example, calculations suggest that the proportion of backscattered electrons which, having entered apertures of the grid on the target side, pass right through the cathode side, may, with a longitudinal to transverse dimension ratio of 1:1, amount to some 50%, but with a ratio of 3:1 the proportion decreases to some 12%, and with a ratio of 5:1 to some 5%. As a result, the "background" due to backscattered electrons is significantly further reduced. A suitable grid with a longitudinal to transverse dimension ratio of at least 3:1 can be formed with apertures of transverse dimension 200 μm by anisotropic etching of a silicon wafer or from photo-etchable glass; as an alternative, the grid may be formed from a channel plate, especially if very long apertures are desired.

FIG. 4 is a diagrammatic transverse cross-section in a longitudinal plane of the projector (on a similar scale to FIG. 3) of a portion of a grid in which the ratio of the longitudinal dimension to the transverse dimension of each of the apertures AP is slightly in excess of 3. The apertures are in thise case disposed in a regular array as depicted in FIG. 3.

Electron image projectors embodying the invention wherein any electric field between the grid and the target is negligibly small provide the advantage particularly for processes requiring the successive projection of various patterns onto the same target (as in the fabrication of integrated circuits), that the target need not be very accurately parallel to the cathode or indeed very accurately flat; for optimum resolution (other factors being the same), it is only necessary that the whole of the area of the slice onto which a pattern is to be projected should lie within the depth of focus (typically about 100 μm). Consequently, a target such as a semiconductor slice can be held in a simple holder (rather than, for example, on an electrostatic chuck as is desirable in a conventional projector), and changes in shape of the target in a direction generally normal to its surface that occur between the projection of successive patterns onto the slice will not substantially affect the reproduction of the patterns, provided the above-mentioned area of the slice remains within the depth of focus.

We claim:

1. In an electron image projector for projecting electrons, comprising:
    an electron emissive cathode for emitting electrons in a predetermined spatial pattern under a substantially uniform high voltage electric field, said spatial pattern extending transversely to said electric field,
    anode means comprising a grid having an array of electron-permeable regions for providing said electric field with said cathode, said array being at least as extensive as said spatial pattern of electrons, wherein said high voltage electric field is produced between said cathode and said grid,
    target means for receiving said spatial pattern of electrons, wherein said grid is disposed between said cathode and said target means and there is a negligible voltage difference between said grid and target means in comparison with the potential difference between said grid and cathode, and
    magnetic means for producing a substantially uniform magnetic field parallel to said electric field,
    the improvement wherein:
    the surface of said grid facing said cathode is spaced from said cathode a distance to be substantially at one magnetic focus, and the target means is spaced from said grid to be substantially at another magnetic focus, and
    wherein means are provided for detecting electrons backscattered from said target means during electron irradiation, said detecting means detecting locations of marker regions of said target means and being disposed between said grid and said target means outside said spatial pattern of electrons.

2. The electron image projector of claim 1 wherein said grid is spaced from said cathode a distance to position said surface of said grid at the first magnetic focus with respect to said cathode.

3. The electron image projector of claim 2 wherein the spacing between said grid and target means is substantially twice the distance between said grid and cathode, wherein said target means is substantially at the second magnetic focus with respect to said cathode.

4. An electron image projector according to claim 1, wherein a potential difference between said grid and said target means is provided by a second electric field of a value much less than said electric field between said cathode and said anode means.

5. An electron image projector according to claim 1, wherein a substantially zero potential difference exists between said grid and said target means.

6. An electron image projector according to claim 1, wherein said grid comprises said array of electron-permeable regions together with electron-impermeable regions, and wherein means are provided for moving said grid transverse to the direction of motion of said electrons so that said spatial pattern received by said target means does not substantially reproduce said array of said grid.

7. An electron image projector according to claim 6, wherein said grid comprises a channel plate.

8. An electron image projector according to claim 1, wherein said grid comprises a regular array of said electronpermeable regions separated by electron-impermeable regions, and wherein said electron-permeable regions have lengths in the direction of motion of said electrons of at least three times the widths of said electron-permeable regions in the direction transverse to said direction of motion.

9. An electron image projector according to claim 1, wherein said grid comprises an anisotropically etched wafer of silicon.

10. An electron image projector according to claim 1, wherein said grid is formed from photo-etchable glass.

11. An electron image projector according to claim 1, wherein said high voltage is 20 kV.

* * * * *